United States Patent
Ee

(10) Patent No.: US 10,373,636 B2
(45) Date of Patent: *Aug. 6, 2019

(54) SUSPENSION HAVING A STACKED D33 MODE PZT ACTUATOR WITH CONSTRAINT LAYER

(71) Applicant: Magnecomp Corporation, Murrieta, CA (US)

(72) Inventor: Kuen Chee Ee, Chino, CA (US)

(73) Assignee: Magnecomp Corporation, Murrieta, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/727,306

(22) Filed: Oct. 6, 2017

(65) Prior Publication Data

US 2018/0033948 A1    Feb. 1, 2018

Related U.S. Application Data

(63) Continuation of application No. 15/402,230, filed on Jan. 9, 2017, now Pat. No. 9,786,831.

(60) Provisional application No. 62/287,684, filed on Jan. 27, 2016.

(51) Int. Cl.

| | |
|---|---|
| G11B 5/48 | (2006.01) |
| G11B 5/55 | (2006.01) |
| H01L 41/09 | (2006.01) |
| H01L 41/047 | (2006.01) |
| H02N 2/02 | (2006.01) |

(52) U.S. Cl.
CPC ............ *G11B 5/5552* (2013.01); *G11B 5/483* (2015.09); *G11B 5/4873* (2013.01); *H01L 41/047* (2013.01); *H01L 41/09* (2013.01); *H01L 41/0913* (2013.01); *H01L 41/0933* (2013.01); *H01L 41/0986* (2013.01); *H02N 2/02* (2013.01); *G11B 5/4833* (2013.01)

(58) Field of Classification Search
CPC ....... G11B 5/483; G11B 5/5552; H01L 41/09; H01L 41/0913; H01L 49/0933
USPC .......................................... 360/294.4, 294.1
See application file for complete search history.

(56) References Cited

U.S. PATENT DOCUMENTS

| | | | |
|---|---|---|---|
| 5,898,541 A | 4/1999 | Boutaghou et al. | |
| 5,907,211 A * | 5/1999 | Hall ...................... | B64C 27/001 310/328 |
| 6,242,844 B1 * | 6/2001 | Puttagunta ......... | H03H 9/14505 310/313 B |
| 6,747,396 B2 | 6/2004 | Blom | |

(Continued)

*Primary Examiner* — Jefferson A Evans
(74) *Attorney, Agent, or Firm* — Nixon Peabody LLP

(57) ABSTRACT

A microactuator for a dual stage actuated suspension for a hard disk drive is constructed as a longitudinal stack of piezoelectric (PZT) elements acting in the d33 mode, expanding or contracting longitudinally when an electric field is applied across them in the longitudinal direction. The microactuator has interlaced electrode fingers that separate and define the individual PZT elements, and apply the electric field. A stiff constraint layer having a high Young's modulus is affixed to the microactuator on the side opposite the suspension to which the microactuator is bonded. The constraint layer may be a layer of substantially inactive PZT material that is formed integrally with the PZT elements but without electrodes in the inactive PZT layer. The presence of the stiff constraint layer increases the effective stroke length of the microactuator.

20 Claims, 3 Drawing Sheets

(56) References Cited

U.S. PATENT DOCUMENTS

| | | |
|---|---|---|
| 6,794,800 B1 | 9/2004 | Heinz |
| 6,943,483 B2 | 9/2005 | Takeuchi et al. |
| 7,068,473 B2 | 6/2006 | O'Neill |
| 7,246,420 B2 | 7/2007 | Takeuchi et al. |
| 7,282,836 B2 | 10/2007 | Kwon et al. |
| 8,896,969 B1 | 11/2014 | Miller et al. |
| 9,117,468 B1 | 8/2015 | Zhang et al. |
| 9,123,880 B2 * | 9/2015 | Ozawa ............... H01L 41/0471 |
| 9,190,601 B2 | 11/2015 | Sumi et al. |
| 9,287,486 B2 * | 3/2016 | Okamura ........... F02M 51/0603 |
| 9,299,908 B2 | 3/2016 | Nakamura et al. |
| 9,318,136 B1 | 4/2016 | Bjorstrom et al. |
| 9,330,694 B1 | 5/2016 | Hahn et al. |
| 9,330,698 B1 | 5/2016 | Hahn et al. |
| 9,330,699 B1 | 5/2016 | Hahn et al. |
| 9,431,041 B1 | 8/2016 | Schreiber et al. |
| 9,558,771 B2 | 1/2017 | Bjorstrom |
| 9,564,154 B2 * | 2/2017 | Bjorstrom .............. G11B 5/483 |
| 9,741,376 B1 * | 8/2017 | Ee ........................... G11B 5/56 |
| 9,786,831 B1 | 10/2017 | Ee |
| 2003/0056351 A1 * | 3/2003 | Wilkie .................. H01L 41/082 29/25.35 |
| 2004/0120081 A1 | 6/2004 | Kurihara et al. |
| 2004/0256955 A1 | 12/2004 | Okazawa et al. |
| 2007/0223146 A1 | 9/2007 | Yao et al. |
| 2009/0195938 A1 | 8/2009 | Yao et al. |
| 2009/0237641 A1 | 9/2009 | Kurihara et al. |
| 2010/0140379 A1 * | 6/2010 | Suzuki ................ H01L 41/0838 239/569 |
| 2011/0180623 A1 * | 7/2011 | Kawamoto ........ F02M 51/0603 239/102.2 |
| 2013/0069490 A1 | 3/2013 | Nakamura et al. |
| 2014/0104722 A1 | 4/2014 | Wright et al. |
| 2016/0181505 A1 * | 6/2016 | Karrai .................. F04B 43/046 310/367 |

\* cited by examiner

SUSPENSION HAVING A STACKED D33 MODE PZT ACTUATOR WITH CONSTRAINT LAYER

CROSS-REFERENCE TO RELATED APPLICATIONS

This application is a continuation of U.S. patent application Ser. No 15/402,230 filed Jan. 9, 2017, which claims benefit of U.S. Provisional Patent Application No. 62/287,684 filed Jan. 27, 2016, each of which is hereby incorporated by reference in their entirety.

BACKGROUND OF THE INVENTION

1. Field of the Invention

This invention relates to the field of suspensions for disk drives. More particularly, this invention relates to the field a microactuator for a suspension, the microactuator having a stacked d33 mode construction and a constraining layer.

2. Description of Related Art

Magnetic hard disk drives and other types of spinning media drives such as optical disk drives are well known. A typical disk drive unit, for example, is shown in FIG. 1 of U.S. Pat. No. 8,879,210 issued to Hahn et al. ("the Hahn '210 patent") which is assigned to the present Applicant and which is incorporated by reference herein. The typical disk drive unit includes a spinning magnetic disk containing a pattern of magnetic storage medium ones and zeroes on it that constitutes the data stored on the disk drive. The magnetic disk is driven by a drive motor. The disk drive unit further includes a disk drive suspension to which a magnetic read/write is mounted proximate a distal end of load beam. The "proximal" end of a suspension or load beam is the end that is supported, i.e., the end nearest to the base plate which is swaged or otherwise mounted to an actuator arm. The "distal" end of a suspension or load beam is the end that is opposite the proximal end, i.e., the "distal" end is the cantilevered end.

The suspension is coupled to an actuator arm, which in turn is coupled to a voice coil motor that moves the suspension arcuately in order to position the head slider over the correct data track on the data disk. The head slider is carried on a gimbal which allows the slider to pitch and roll so that it follows the proper data track on the disk, allowing for such variations as vibrations of the disk, inertial events such as bumping, and irregularities in the disk's surface.

Both single stage actuated disk drive suspensions and dual stage actuated (DSA) suspension are known. In a single stage actuated suspension, only the voice coil motor moves the suspension.

In a DSA suspension a small actuator located on the suspension moves the head slider in order to position the head slider over the correct data track. The actuator provides both finer positioning of the head slider than does the voice coil motor, and provides higher servo bandwidth than does the voice coil motor. The actuator may be located in various places on the suspension depending on the particular DSA suspension design. Typically, left- and right-side actuators act in push-pull fashion to rotate the load beam or the distal end of the load beam. Some of the earliest DSA suspension designs placed the actuator on the baseplate, with actuation of the PZTs causing the entire load beam to rotate. Actuators used in DSA suspension have been called milliactuators or microactuators. Dual stage actuated (DSA) suspensions have become common in recent years as data track widths have continued to decrease.

A piezoelectric element is often used as the microactuator motor, although static electric microactuators and other types of microactuator motors have been proposed and used. A commonly used piezoelectric material is lead zirconate titanate (PZT), although other piezoelectric materials are also used and known. In the discussion and claims that follows, for simplicity the piezoelectric device that is the microactuator will sometimes be referred to simply as a "PZT" for shorthand, it being recognized that the piezoelectric material need not be lead zirconate titanate. Thus, as used herein the term "PZT" can refer to any piezoelectric material or any piezoelectric device formed of any piezoelectric material.

Other exemplary DSA suspensions are disclosed in U.S. Pat. No. 9,117,468 issued to Zhang et al., and U.S. Pat. No. 8,879,210 to Hahn et al., both of which are assigned to the assignee of the present application.

FIG. 1 is a top plan view of a prior art DSA suspension in which two PZTs are mounted near the gimbal, and act directly on the gimbal through flexible connectors. That suspension is similar to the suspension shown in the Hahn '210 patent. Such suspensions are sometimes called gimbal DSA suspensions, or simply GSA suspensions. A GSA suspension is one type of DSA suspension. In the figure, suspension 10 includes a flexure 20 which is mounted to load beam 12. Flexure 20 includes electrical circuit 22 which includes copper contact pad 24 which carries the PZT driving voltage, and copper contact pad 28 which is grounded. The PZTs 14 act on head slider 30 which is mounted to a gimbaled area of flexure 20 via thin ribbon-like flexible stainless steel connectors 26. One PZT expands while the other contracts, rotating head slider 30 slightly in order to position the magnetic transducers within slider 30 over the desired spot on disk platter 101 with precision.

SUMMARY OF THE INVENTION

The present invention is of a PZT microactuator, and of a suspension having the PZT microactuator. The microactuator is constructed as a stack of PZT elements acting in the d33 mode, that is, expanding or contracting longitudinally when an electric field is placed across them in the longitudinal direction. The microactuator has a stiff constraint layer or constraining layer adhesively bonded to it, or formed integrally with it, on the side of the microactuator that is opposite the side that is mounted to the suspension. The stiff constraint layer tends to oppose expansion or contraction of the PZT, which actually increases the effective stroke length of the device.

Exemplary embodiments of the invention will be further described below with reference to the drawings, in which like numbers refer to like parts. The drawing figures might not be to scale, and certain components may be shown in generalized or schematic form and identified by commercial designations in the interest of clarity and conciseness.

DETAILED DESCRIPTION OF THE PREFERRED EMBODIMENTS

Figure 2:
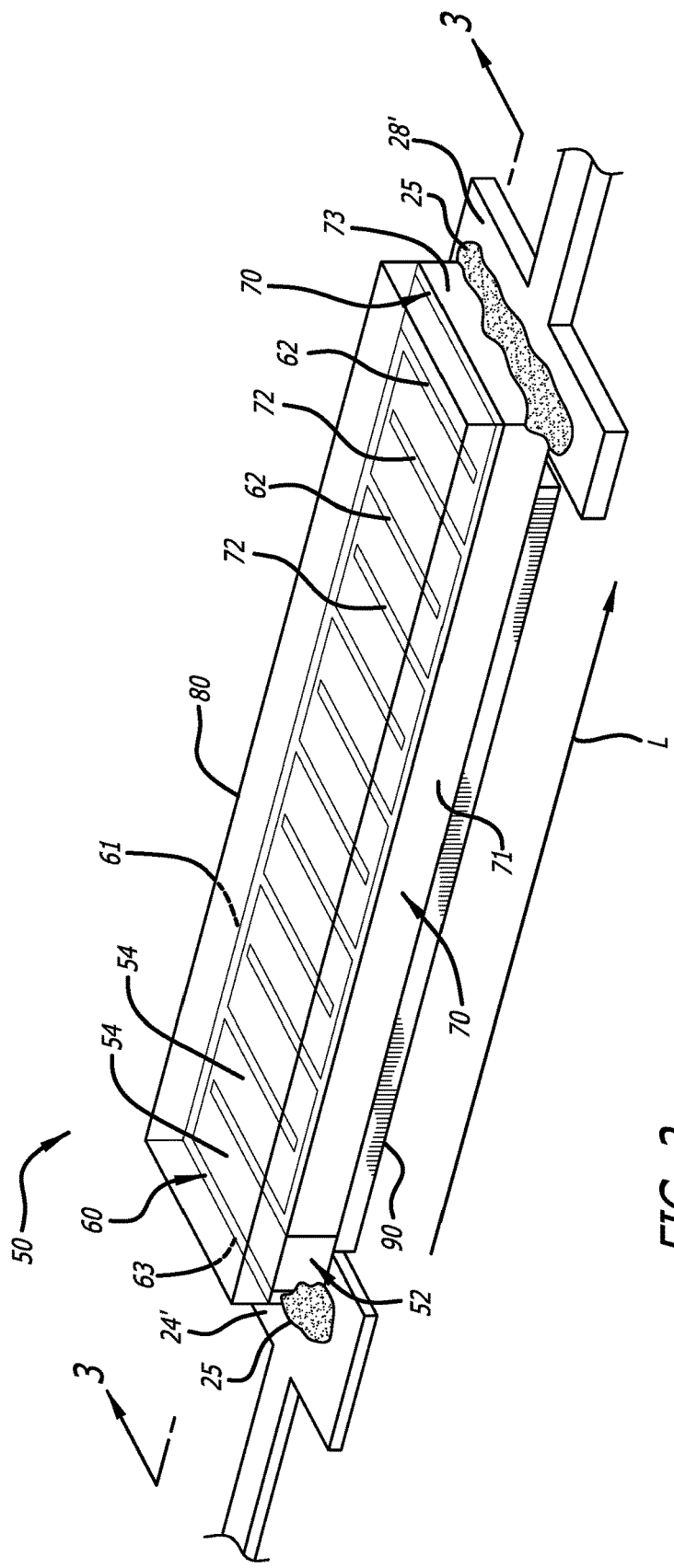
FIG. 2 is a side perspective view of a stacked d33 mode PZT with constraint layer according to an exemplary embodiment of the present invention.

FIG. 2 is a side perspective view of a d33 mode PZT actuator 50 having a constraint layer 80 in an exemplary embodiment of the invention. PZT actuator 50 includes a first PZT material layer or section 52. The first PZT material layer extends in a generally longitudinal direction L. A first or positive electrode 60 includes a side wall 61 from which a plurality of first or positive electrode fingers 62 extend laterally into the PZT layer 52, and an end wall 63. Similarly, a second or negative electrode 70 includes a side wall 71 from which a plurality of second or negative electrode fingers 72 extend laterally into PZT layer 52, and an end wall 73. The first and second electrode fingers 62, 72 define a plurality of interlacing or interdigitated electrode fingers extending laterally into the PZT layer 52, with the fingers 62 of the first electrode 60 being connected by the first longitudinally extending side wall connector 61, and the fingers 72 of the second electrode 70 being connected by a second longitudinally extending side wall connector 71. Similarly structured electrodes are sometimes called comb electrodes. Between interlacing fingers 62, 72 lie individual PZT elements 54, with the fingers 62 and 72 delineating those individual PZT elements 54, and successive ones of the PZT elements 54 being located along the longitudinal direction. The PZT actuator 50 is poled using the electrodes such that, in operation, when a voltage is applied across electrodes 60, 70, an electric field is induced in the longitudinal direction across the individual PZT elements 54 causing those elements to act in their d33 modes in the longitudinal direction, expanding or contracting depending on the polarity of the applied voltage. The expansion or contraction occurs in the same direction as the electric field, namely, the longitudinal direction. The total expansion or contraction of PZT actuator 50 generally equals the sum of the individual expansion or contraction of the individual PZT elements 54.

First and second electrodes 60, 70 have been termed the "positive" and "negative" electrodes somewhat arbitrarily; at the device level either a positive or a negative voltage can be placed across the two electrodes thus causing the device to expand or contract, respectively. In practice, when a PZT device is installed in an environment and one electrode is grounded as installed, the two electrodes are often referred to as the ground electrode and the drive electrode.

The PZT actuator 50 includes a constraint layer or constraining layer 80 affixed on the side of the device away from the side of the device that is mounted to the suspension. For purposes of discussion, the side of device 50 which is adhered to the suspension will be referred to as the bottom side, and the opposite site on which the constraint layer 80 is located will be referred to as the top side.

Constraint layer 80 is made of a stiff material preferably having a Young modulus of greater than or equal to 50 GPa. The constraint layer 80 tends to resist the expansion or contraction of the PZT device 50, and hence tends to reduce, eliminate, or even change the sign of bowing that would occur in device 50 due to it expanding or contracting while being bonded on its bottom side to the suspension. The presence of the constraint layer 80 therefore actually increases the effective stroke length of the device as compared to if the constraint layer were not present, which is a counterintuitive result. The theory of operation of the constraint layer is discussed more fully in U.S. Pat. No. 9,117,468 by Zhang et al. which is assigned to the assignee of the present application, and which is incorporated herein by reference for its teaching of constraint layers.

In one embodiment, the constraint layer 80 is a layer of stiff material such as stainless steel or silicon that is adhered to the device using adhesive.

In another embodiment, the constraint layer 80 is a layer of active PZT material, but with layer 80 acting differently than the PZT layer 52 when a voltage is applied across the device's electrodes.

In a first variation, the constraint layer 80 is a passive layer of substantially inactive PZT material, such that the device includes a first layer or section 52 of active PZT material, and a second layer or section 80 of substantially inactive PZT material. The PZT material that defines constraint layer 80 may be integrally formed with the material of PZT layer 52 and above that layer including its electrodes 60, 70, such as by well known sol-gel or thin film deposition techniques. In the sol-gel method, the green PZT material is laid down in fluid form and thereafter hardened. The PZT material of constraint layer 80 could be substantially inactive material either because it was never poled, and/or because there are no electrodes or at least no electrically connected electrodes extending into it that would induce an electric field across that material when an actuation voltage is applied across the first and second electrodes 60, 70. In this way, no substantial electric field is applied across inactive PZT layer 80, and thus inactive PZT layer 80 acts as a constraint layer tending to oppose expansion or contraction of active PZT layer 52. The inactive PZT layer 80 could be thicker than, thinner than, or of the same thickness as active PZT layer 52 and the vertical height of its electrodes 60, 70.

In another variation of the constraint layer being of PZT material but acting differently than main PZT layer 52, the constraint layer 80 is of PZT material but that material is not completely inactive. The constraint layer 70 could be made less piezoelectrically active than first PZT layer 52 by one of various techniques including but not limited to (a) making the electrode fingers to be shorter in the lateral direction than are the fingers 62, 72 in the first PZT layer 52; (b) making the electrode fingers 62, 72 to be fewer and farther apart than they are in the first PZT layer 52, or (c) the piezoelectric material in the constraint layer 80 having a different composition than in the first layer 52, the material of constraint layer 80 being less piezoelectrically active than first layer 52.

In yet another variation, the constraint layer 80 tends to act in the opposite direction as main PZT layer 52, such as taught in co-owned U.S. Pat. No. 9,330,694 to Hahn et al. and which is hereby incorporated by reference for its teaching of a PZT actuator having an active constraint layer.

In the embodiment shown, an insulation layer 90 covers most, but not all, of the bottom side of the device, leaving positive electrode 60 and negative electrode 70 exposed not only on the end walls 63, 73 of the device, but also electrically exposed at opposite ends of the bottom of the device. Conductive bridge 25 at either end of the device carries the activation voltages from copper contact pads 24', 28' of flexible circuit 22. The conductive bridge can be formed by, for example, a solder bridge formed by a solder jet ball (SJB) process, or it can be conductive epoxy. Alternatively, one of the electrodes 60, 70 can be a ground electrode, with conductive bridge 25 bridging from the ground electrode to the stainless steel layer of the flexure, preferably with a thin layer of nickel and then gold plated onto the stainless steel for a higher quality and corrosion-resistant ground connection. U.S. Pat. No. 9,025,285 to Lazatin et al., which is assigned to the assignee of the present application, is hereby incorporated by reference for its teachings of spot plating gold onto stainless steel such as for microactuator grounding in a suspension.

Alternatively, because insulation layer 90 covers most of the bottom of the device but leaves exposed only the electrodes at the very ends of the device, conductive epoxy could be used to bond the device to the suspension, with the conductive epoxy electrically connecting first electrode 60 to copper contact pad 24', and second electrode 70 to copper contact pad 28'.

Still further, conductive epoxy could bond the ground electrode directly to the grounded stainless steel layer of the trace gimbal or other part of the suspension. For example, if second electrode 70 is the ground electrode, then copper contact pad 28' and it insulation layer below could be eliminated, with conductive epoxy directly connecting ground electrode 70 to that grounded stainless steel. In such a case, preferably the stainless steel will have a thin layer of nickel and gold plated thereon to ensure a high quality electrical connection.

Figure 3:
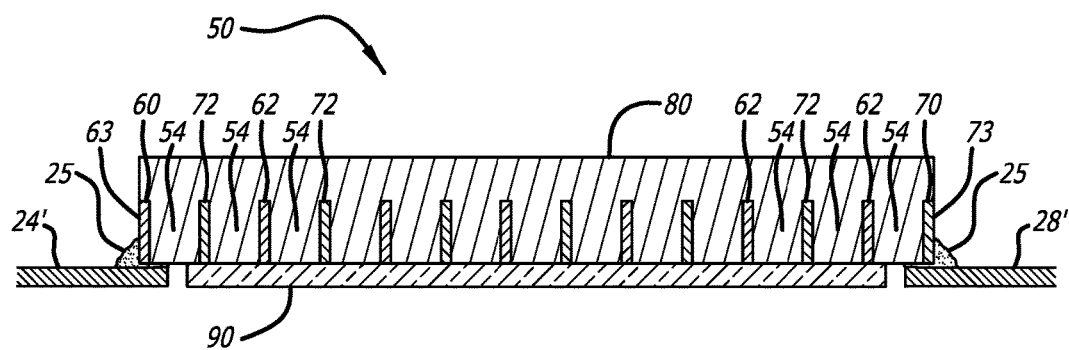
FIG. 3 is a side sectional view of the PZT actuator 50 of FIG. 2 taken along section line 3-3.

As an alternative to the comb electrodes shown in FIG. 3 with conductive side walls 61, 71 being used to connect the electrode fingers, electrical vias can be formed through the PZT elements to connect the electrode fingers. PZTs having electrical vias in them, and methods of forming those PZTs and vias, are discussed in, e.g., U.S. Pat. No. 8,773,820 to Hahn et al. which is assigned to the assignee of the present application and which is hereby incorporated by reference.

The electrical connections disclosed above are merely exemplary. Various other electrical connection configurations are possible, as will be apparent to those skilled in the art of suspension design. For example, the PZT actuator can be bonded to the suspension using non-conductive epoxy. In such a case, insulating layer 90 may not be needed. An electrical connection from contact pads 24' or 28' to the PZT actuator can be made to the end wall electrodes 63, 73 of the device using solder jet ball bonding or using conductive epoxy.

FIG. 3 is a side sectional view of the PZT actuator 50 of FIG. 2 taken along section line 3-3.

Figure 4:
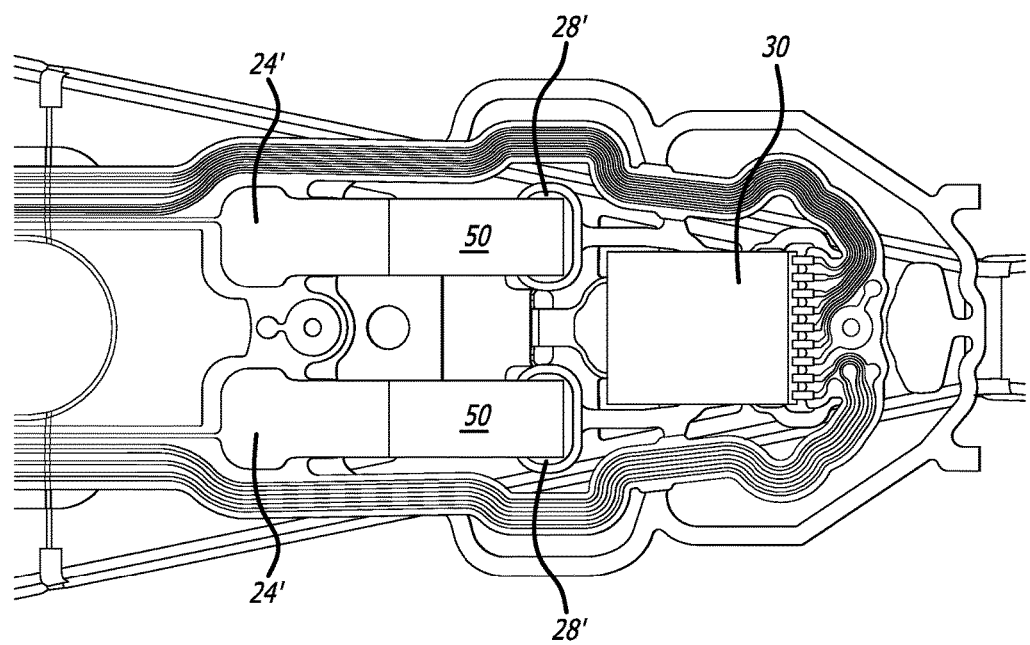
FIG. 4 is a top plan view of two of the PZTs of FIG. 2 mounted to a disk drive suspension.

FIG. 4 is a top plan view showing two of the PZTs of FIG. 2 mounted to a disk drive suspension. PZT actuators 50 are illustrated as being approximately half the length of PZT actuators 14 in prior art FIG. 1, which employs PZT microactuators acting in their d31 modes, to illustrate the fact that the d33 mode exhibits approximately twice the stroke length per unit of input voltage as the d31 mode. Accordingly, a PZT actuator according to the invention, which operates in the d33 mode, only needs to be approximately one half as long as prior art PZT actuators operating in the d31 modes in order to achieve the same stroke length for the same actuation voltage. Because a PZT actuator according to the invention needs to be only about half as long and therefore requires approximately half the mass as a d31 mode PZT actuator, a suspension made according to the invention will have less mass near the slider and hence will exhibit a higher servo bandwidth and higher shock tolerance. Additionally, the PZT should exhibit less susceptibility to shock-induced or other mechanical stress-induced cracking and resultant degradation or failure.

Figure 1:
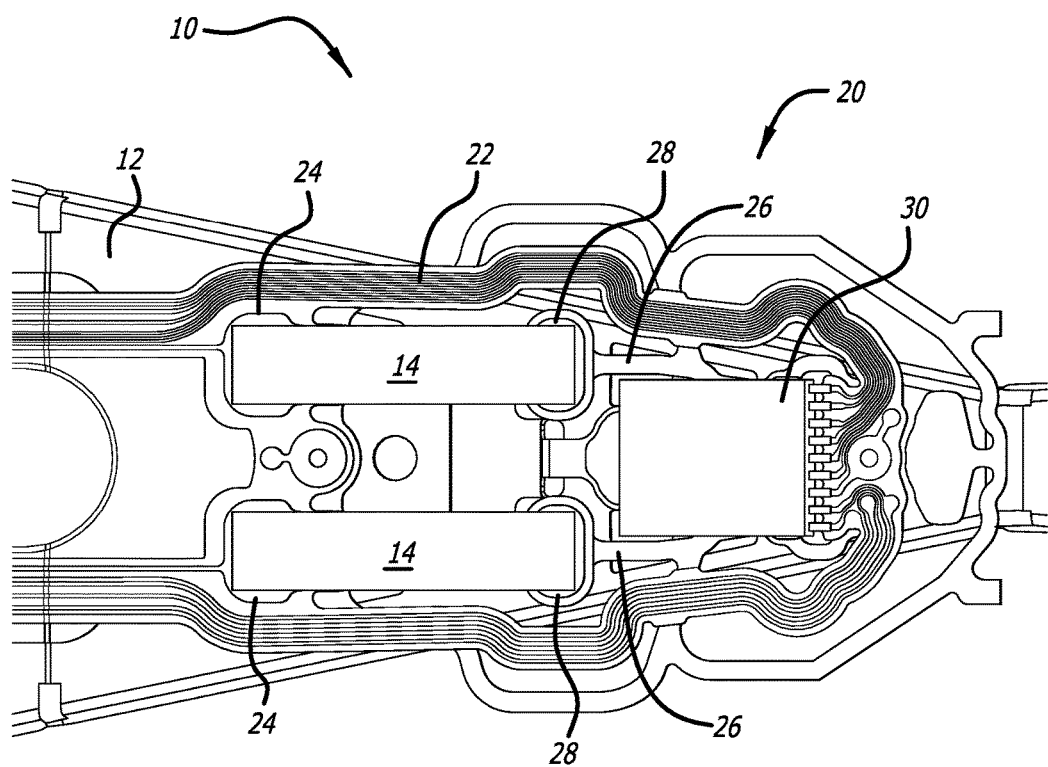
FIG. 1 is top plan view of a prior art DSA suspension.

Table 1 below presents the results of a simulation comparing the PZT actuator structure of FIGS. 2-4 to the prior art structure of FIG. 1. As can be seen in the table, the overall PZT size was reduced by half, while the stroke sensitivity was maintained and even increased somewhat. For simplicity, dead zones were neglected in the simulation model.

TABLE 1

| Simulated Device | Stroke (nm/V) | Length (mm) | Width (mm) | Thickness (mm) | Volume | Vol. Ratio |
|---|---|---|---|---|---|---|
| Prior Art: 25 μm Passive Constraint Layer + 40 μm active PZT Layer | 14.7 | 1.554 | 0.35 | 0.065 | 0.0354 | 100% |
| FIG. 3: Constraint Layer + 20 Layer d33 (40 μm/layer) | 17.8 | 0.8 | 0.35 | 0.065 | 0.0182 | 51% |

It will be understood that the terms "generally," "approximately," "about," "substantially," and "coplanar" as used within the specification and the claims herein allow for a certain amount of variation from any exact dimensions, measurements, and arrangements, and that those terms should be understood within the context of the description and operation of the invention as disclosed herein.

It will further be understood that terms such as "top," "bottom," "above," "below," "laterally," and "longitudinally" as used within the specification and the claims herein are terms of convenience that denote the spatial relationships of parts and directions relative to each other rather than to any specific spatial or gravitational orientation. Thus, the terms are intended to encompass an assembly of component parts regardless of whether the assembly is oriented in the particular orientation shown in the drawings and described in the specification, upside down from that orientation, or any other rotational variation.

Although the present invention has thus been described in detail with regard to the preferred embodiments and drawings thereof, it should be apparent to those skilled in the art that various adaptations and modifications of the present invention may be accomplished without departing from the spirit and the scope of the invention. Accordingly, it is to be understood that the detailed description and the accompanying drawings as set forth hereinabove are not intended to limit the breadth of the present invention, which should be inferred only from the following claims and their appropriately construed legal equivalents.

I claim:

1. A piezoelectric (PZT) actuator, the PZT actuator comprising:
    a PZT layer;
    a first electrode having a plurality of first electrode fingers extending into the PZT layer;
    a second electrode having a plurality of second electrode fingers extending into the PZT layer;
    the first electrode fingers and the second electrode fingers interlaced to define a plurality of interlacing fingers, the interlacing fingers configured to define a plurality of PZT elements within the PZT layer and between the interlaced fingers, the PZT elements successively located in a longitudinal direction;
    the PZT elements poled such that when a voltage is applied across the first and second electrodes, the PZT elements are configured to expand or contract in the longitudinal direction; and
    a stiff constraint layer located on a top side of the PZT actuator away from an opposite bottom side of the PZT actuator at which the PZT actuator is bonded to a suspension, the constraint layer configured to oppose expansion or contraction of the PZT elements.

2. The PZT actuator claim 1 wherein the constraint layer comprises a material having a Young's modulus of greater than 50 GPa.

3. The PZT actuator of claim 2 wherein the constraint layer is adhered to the PZT elements.

4. The PZT actuator of claim 1 wherein the constraint layer includes inactive PZT material.

5. The PZT actuator of claim 1 wherein the constraint layer includes inactive PZT material that is formed integrally with and above the PZT elements.

6. The PZT actuator of claim 1 wherein the constraint layer includes PZT material that has no electrodes for inducing a significant electric field therein.

7. The PZT actuator of claim 1 further comprising an insulating layer on the bottom side, the insulating layer configured to cover a bottom side of most of the interlaced fingers but leaving a portion of the first electrode and a portion of the second electrode electrically accessible from the bottom side.

8. A piezoelectric (PZT) actuator, the PZT actuator comprising:
a plurality of PZT elements;
first and second electrodes defining a plurality of interlaced fingers, the fingers configured to extend between individual ones of the PZT elements;
the PZT elements poled and arranged such that when a voltage is applied across the first and second electrodes, the individual ones of the PZT elements between the interlaced fingers are configured to expand or contract in their d33 mode, the expanding or contracting adding serially such that an overall expansion or contraction of the PZT actuator generally equals a cumulative expansion or contraction of the individual ones of the PZT elements; and
a stiff constraint layer located on a top side of the PZT actuator away from an opposite bottom side of the PZT actuator at which the PZT actuator is affixed to a suspension, the constraint layer configured to oppose the overall expansion or contraction of the PZT actuator and thus to increase an effective stroke length of the PZT actuator as compared to if the PZT actuator lacked the constraint layer.

9. The PZT actuator of claim 8 wherein the stiff constraint layer includes substantially inactive PZT material.

10. The PZT actuator of claim 9 wherein the inactive PZT material of the constraint layer is formed integrally with the individual PZT elements.

11. The PZT actuator of claim 9 wherein the inactive PZT material of the constraint layer is formed by applying PZT material in fluid form over the interlacing fingers and thereafter hardened.

12. The PZT actuator of claim 9 wherein said expansion or contraction occurs in a longitudinal direction, and the interlacing fingers do not extend vertically into the substantially inactive PZT material.

13. A piezoelectric (PZT) actuator, the PZT actuator comprising:
a first section of PZT material;
a second section of PZT material on the first section of PZT material and affixed thereto; and
first and second electrodes, each of the electrodes having fingers that extend laterally into the first section of PZT material, the portions of PZT material within the first section and between fingers that are adjacent in a longitudinal direction configured to define individual PZT elements;
wherein:
the PZT elements within the first section are poled such that, when an activation voltage is applied across the first and second electrodes,. electric fields in the longitudinal direction are applied across the PZT elements causing the PZT elements to expand or contract in the longitudinal direction, and such that the overall first section of PZT material expands or contracts in the longitudinal direction; and
when the activation voltage is applied across the first and second electrodes, the second section of PZT material is configured to act differently than the first section of PZT material thus configured to oppose the expansion or contraction of the first section of PZT material.

14. The PZT actuator of claim 13 wherein the second section of PZT material is formed integrally with the first section of PZT material and above the electrode fingers.

15. The PZT actuator of claim 13 wherein the second section of PZT material is substantially unpoled PZT material.

16. The PZT actuator of claim 13 wherein the second section of PZT material has no electrode fingers extending laterally therein.

17. The PZT actuator of claim 13 wherein the second section of PZT material has fewer electrode fingers extending laterally therein than the first section.

18. The PZT actuator of claim 13 wherein the second section of PZT material has electrode fingers extending therein that are shorter than the electrode fingers extending into the first section.

19. The PZT actuator of claim 13 wherein the electrode fingers in the first section of PZT material have an average vertical height, the second section of PZT material has no electrode fingers therein, and the second section of PZT material has a thickness that is at least as great as the average vertical height of the electrode fingers in the first section of PZT material.

20. The PZT actuator of claim 13 wherein the electrode fingers extend vertically through the first section of PZT material but do not extend vertically through the second section of PZT material.

* * * * *